(12) United States Patent
Akhavain et al.

(10) Patent No.: US 6,476,346 B2
(45) Date of Patent: Nov. 5, 2002

(54) METHOD FOR PREDICTING AND AVOIDING A BAD BOND WHEN UTILIZING FIBER PUSH CONNECT LASER BONDING

(75) Inventors: Mohammad Akhavain, Escondido, CA (US); Say-Teng Lai, Singapore (SG); Robert-Scott Melendrino Lopez, Escondido, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/862,686

(22) Filed: May 21, 2001

(65) Prior Publication Data

US 2002/0000427 A1 Jan. 3, 2002

Related U.S. Application Data

(62) Division of application No. 09/183,957, filed on Oct. 31, 1998, now Pat. No. 6,236,105, which is a continuation-in-part of application No. 08/843,492, filed on Apr. 16, 1997, now Pat. No. 6,236,915, which is a continuation of application No. 08/558,567, filed on Oct. 31, 1995, now abandoned.

(51) Int. Cl.[7] ............................................. B23K 26/00
(52) U.S. Cl. ................................................ 219/121.64
(58) Field of Search ....................... 219/121.63, 121.64; 228/180.21, 180.22, 234.1, 235.1; 250/227.15, 227.2; 356/731, 433

(56) References Cited

U.S. PATENT DOCUMENTS

| | | | | |
|---|---|---|---|---|
| 4,476,512 A | * | 10/1984 | Sunago et al. | 219/121.83 |
| 4,812,641 A | * | 3/1989 | Ortiz, Jr. | 219/121.62 |
| 5,319,195 A | * | 6/1994 | Jones et al. | 219/121.62 |
| 5,565,119 A | * | 10/1996 | Behun et al. | 219/121.6 |
| 6,072,148 A | * | 6/2000 | Azdasht | 219/121.63 |

* cited by examiner

Primary Examiner—Tom Dunn
Assistant Examiner—Jonathan Johnson
(74) Attorney, Agent, or Firm—Dennis G. Stenstrom

(57) ABSTRACT

The disclosure describes a method for predicting and avoiding bad bonds or connections when performing electrical connection of two electrical conductors by using a laser light beam attached to an optical fiber system which directs the light to the spot to be bonded. The method provides for rapid detection of damaged optical fibers before bad bonds or connections occur. Disclosed is a method for predicting and avoiding bad bonds or connections when performing solderless electrical connection of two contact elements by using a laser light beam attached to a optical fiber system which directs the light to the spot to be bonded.

12 Claims, 10 Drawing Sheets

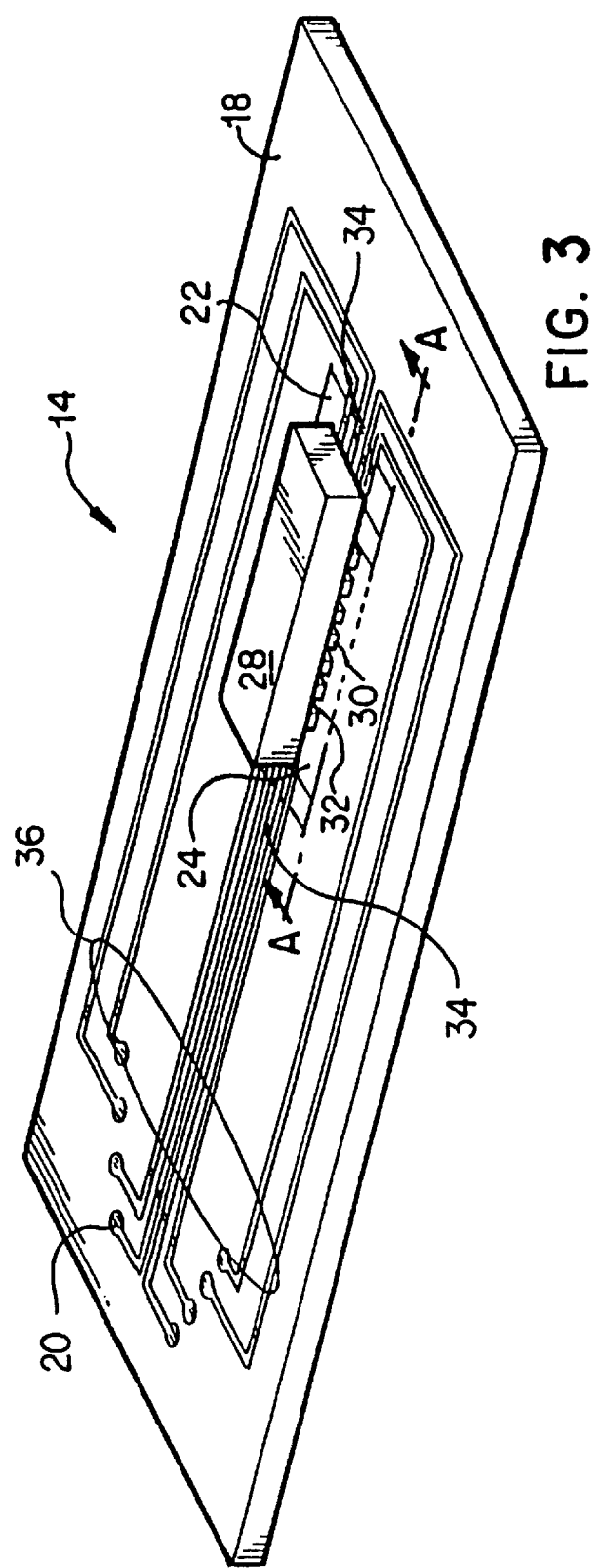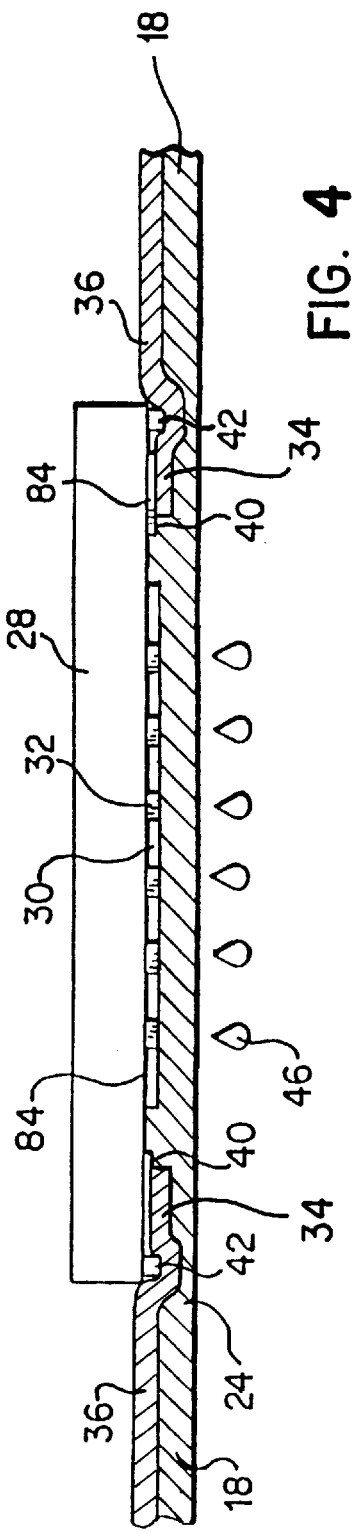

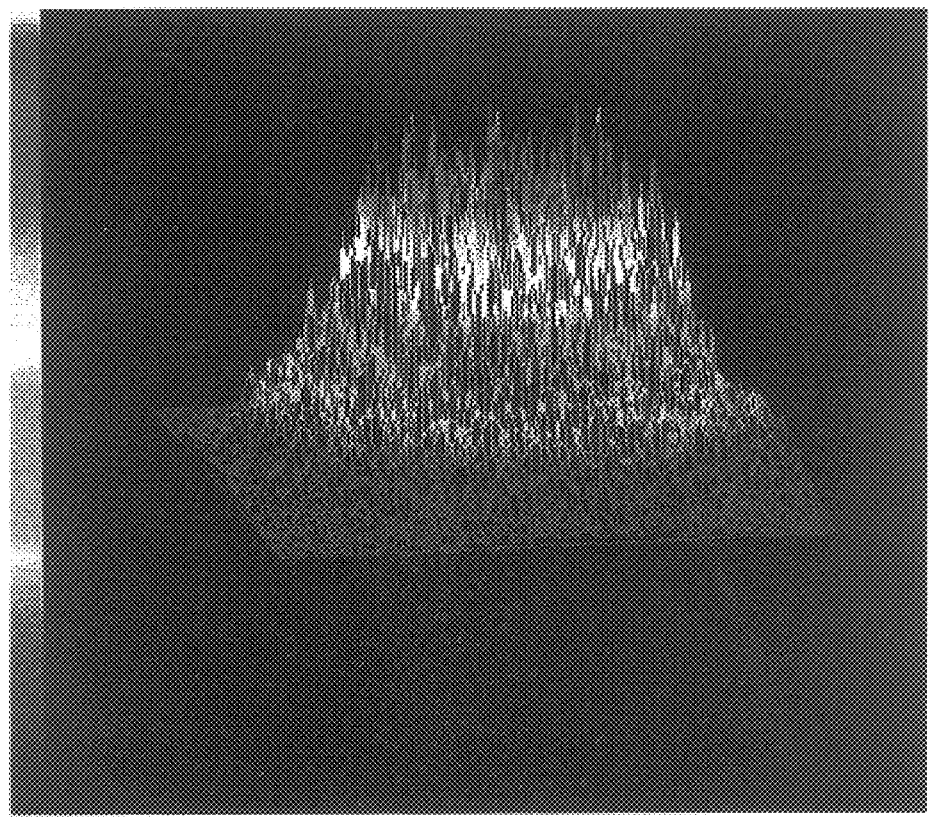
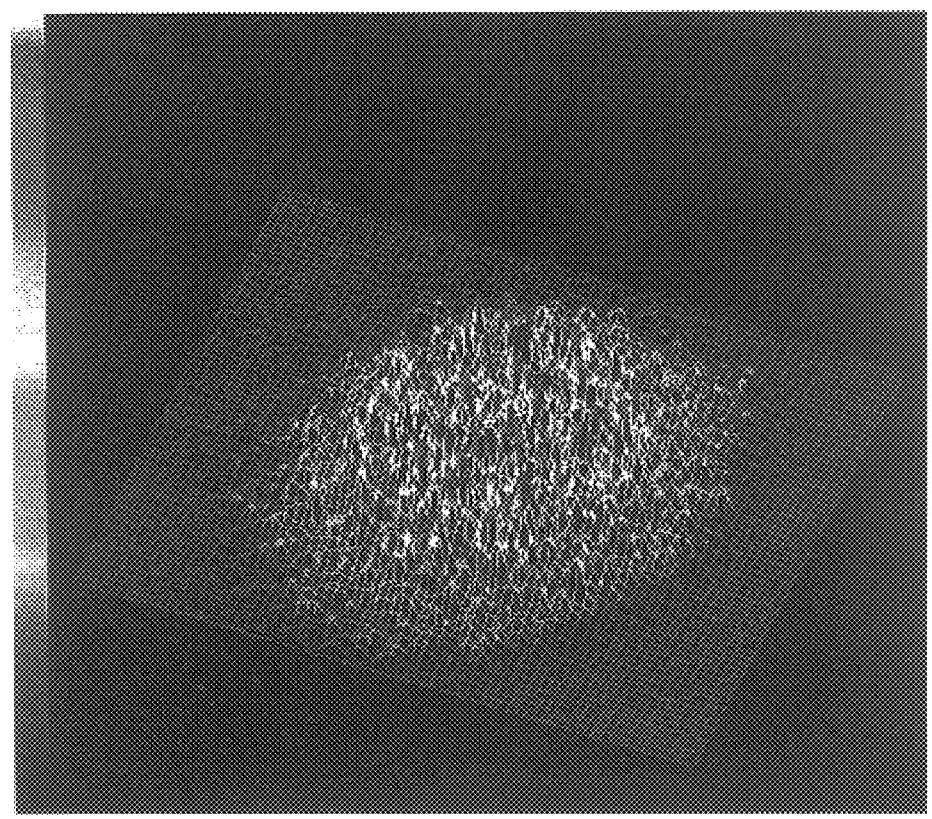
FIG.9

METHOD FOR PREDICTING AND AVOIDING A BAD BOND WHEN UTILIZING FIBER PUSH CONNECT LASER BONDING

CROSS-REFERENCE TO RELATED APPLICATIONS

This application is a divisional of Ser. No. 09/183,957, filed Oct. 31, 1998, now U.S. Pat. No. 6,236,105, which is a continuation in part of co-pending U.S. patent application Ser. No. 08/843,492, filed Apr. 16, 1997, entitled, "Solderless Connection of Electrical Contacts Utilizing Combination Laser and Fiber Optic Push Connect System," now U.S. Pat. No. 6,236,915 which is a continuation of U.S. patent application Ser. No. 08/558,567, filed Oct. 31, 1995, entitled, "Solderless Connection of Electrical Contacts Utilizing Combination Laser and Fiber Optic Push Connect System" now abandoned and is related to U.S. patent application Ser. No. 08/705,928, filed Aug. 30, 1996, entitled "Laser Welded Inkjet Printhead Assembly Utilizing a Combination Laser and Fiber Optic Push Connect System," now U.S. Pat. No. 5,847,356. The foregoing commonly assigned U.S. Patent Applications are herein incorporated by reference.

FIELD OF THE INVENTION

The present invention generally relates to the electrical connection of two elements and, more particularly, to the solderless connection of two elements using an optical fiber that holds the electrical elements in contact while directing a laser emission to the location to be bonded.

BACKGROUND OF THE INVENTION

Thermal inkjet print cartridges operate by rapidly heating a small volume of ink to cause the ink to vaporize and be ejected through one of a plurality of orifices so as to print a dot of ink on a recording medium, such as a sheet of paper. The properly sequenced ejection of ink from each orifice causes characters or other images to be printed upon the paper as the printhead is moved relative to the paper.

A conventional inkjet printhead generally includes: (1) ink channels to supply ink from an ink reservoir to each vaporization chamber proximate to an orifice; (2) a metal orifice plate or nozzle member in which the orifices are formed in the required pattern; and (3) a silicon substrate containing a series of thin film resistors, one resistor per vaporization chamber.

To print a single dot of ink, an electrical current from an external power supply is passed through a selected thin film resistor. The resistor is thereby heated, in turn superheating a thin layer of the adjacent ink within a vaporization chamber, causing explosive vaporization, and, consequently, causing a droplet of ink to be ejected through an associated orifice onto the paper.

In U.S. application Ser. No. 07/862,668, filed Apr. 2, 1992, entitled "Integrate Nozzle Member and TAB Circuit for Inkjet Printhead," a novel nozzle member for an inkjet print cartridge and method of forming the nozzle member are disclosed. This integrated nozzle and circuit design is superior to the orifice plates for inkjet printheads formed of nickel and fabricated by lithographic electroforming processes. A barrier layer includes vaporization chambers, surrounding each orifice, and ink flow channels which provide fluid communication between an ink reservoir and the vaporization chambers. A flexible electrical conductor having conductive traces formed thereon has formed in it nozzles or orifices by Excimer laser ablation. Throughout this document, the terminology "electrical conductor" is used generally to refer to a well-known kind of multiconductor flat cable, sometimes called a flex circuit, that is made up of a flat, insulating polymeric tape and multiple narrow, extremely thin, conductive metallic strips carried on the tape. By providing the orifices in the electrical conductor itself, the novel method overcomes the shortcomings of conventional electroformed orifice plates. The resulting printhead subassembly having orifices and conductive traces may then have mounted thereon a substrate containing ink ejection elements associated with each of the orifices. The leads at the end of the conductive traces formed on the back surface of the printhead subassembly are then connected to the electrodes on the substrate and provide energization signals for the ink ejection elements.

An existing solution for bonding the conductive traces formed on the back surface of the printhead subassembly to the electrodes on the substrate includes the solderless electrical connection of two contact elements by using a laser light beam attached to a fiber optic system which directs the light to the spot to be bonded. The method results in solderless gold to gold compression bonding of conductive leads on a polymer flex circuit tape, such as a polyamide, without damaging the tape. A strong solderless gold to gold bond can be formed between the gold plated copper lead on the flex circuit tape and a gold plated pad on a semiconductor chip. As with all bonding procedures a method for determining bad or low strength bonds is required. Damaged bonds or low strength bonds are usually detected by a sampling plan. This method utilizes shear tests to measure low bond strength. This is a destructive test and must consume small a number of samples. Another method to detect a bad bond utilizes an IR feedback to report any damage to the bond as a result of burning. This is a non-destructive method, however, it is only capable of detecting a burned bond. A low strength bond may not be detected by this method.

One principal cause of low strength bonds is use of a damaged optical fiber. Accordingly, it would be advantageous to have a process to predict and eliminate bad or low strength bonds caused by optical fiber damage during laser TAB bonding process without destructive testing.

SUMMARY OF THE INVENTION

The present invention provides a method for predicting and avoiding bad bonds or connections when performing solderless electrical connection of two contact elements by using a laser light beam attached to an optical fiber system which directs the light to the spot to be bonded. The method provides for the detection of damaged optical fibers before bad bonds or connections occur. A preferred embodiment of the method of the present invention performs optical fiber push laser bonding operations on electric conductor leads and includes providing an optical fiber push laser bonding system and method having an optical fiber for directing a laser beam, positioning first and second electrical leads in a bonding position, holding the first and second electrical leads in contact at a bond surface with an optical fiber, bonding the first and second electrical leads at the bond surface by directing the laser beam through the optical fiber, repeating said positioning, holding and bonding steps for a plurality of bonds, and interrupting the aforesaid laser bonding operations in order to examine the condition of the fiber; wherein the following procedures occur during said interrupting: directing the laser beam through the optical fiber, capturing the spatial energy distribution of the laser beam exiting the optical fiber and analyzing the spatial energy distribution of the laser beam to determine condition of the optical fiber in order to determine the need for corrective action.

BRIEF DESCRIPTION OF THE DRAWINGS

FIG. 3 is a highly simplified perspective view of the back surface of a printhead assembly having an electrical conductor with a silicon substrate mounted thereon and the conductive leads of the electrical conductor attached to the substrate.

FIG. 4 is a side elevational view in cross-section taken along line A—A in FIG. 5 illustrating the attachment of conductive leads to electrodes on the silicon substrate.

FIG. 9 illustrates the spatial energy spectrum of a damaged fiber.

DETAILED DESCRIPTION OF THE PREFERRED EMBODIMENTS

While the present invention will be described, for purposes of illustration only, in conjunction with the bonding of conductive leads on an electrical conductor to the silicon substrate of an inkjet printhead, the present method for predicting and avoiding bad bonds or connections when performing the solderless electrical connection of two contact elements by using a laser light beam attached to a fiber push optic system is applicable to bonding other types of electrical members to each other.

Figure 1:
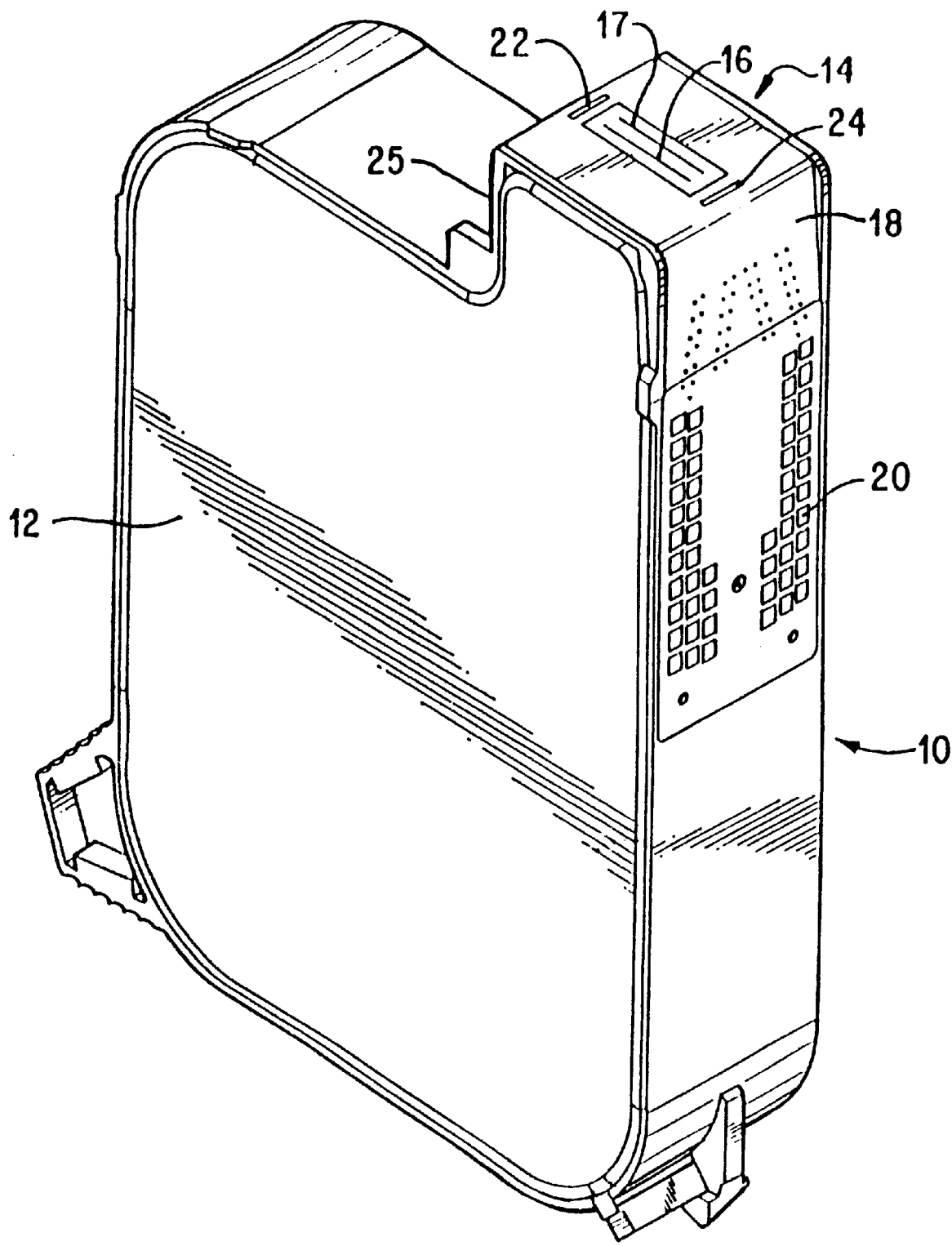
FIG. 1 is a perspective view of an inkjet print cartridge according to one embodiment of the present invention.

Referring to FIG. 1, reference numeral 10 generally indicates an inkjet print cartridge incorporating a printhead according to one embodiment of the present invention simplified for illustrative purposes. The inkjet print cartridge 10 includes an ink reservoir 12 and a printhead assembly 14, where the printhead assembly 14 includes a flexible polymer electrical conductor 18, a nozzle member 16 comprising two parallel columns of offset holes or orifices 17. The orifices 17 may be formed in the electrical conductor 18 by, for example, laser ablation.

A back surface of the electrical conductor 18 includes conductive traces 36 formed thereon using a conventional photolithographic etching and/or plating process. These conductive traces 36 are terminated by contact pads 20 on the front surface of the electrical conductor 18. The print cartridge 10 is designed to be installed in a printer so that the contact pads 20 contact electrodes on the printer carriage that provide externally generated energization signals to the contact pads 20. Bonding occurs in bonding regions 22, 24 where the conductive traces 36 of electrical conductor 18 are bonded to electrodes 40 (shown in FIG. 4) on a silicon substrate 28.

In the print cartridge 10 of FIG. 1, the electrical conductor 18 is bent over the back edge of the print cartridge "snout" and extends up the back wall and front wall of the snout. The contact pads 20 located on the electrical conductor 18 are secured to the front wall of the snout and the conductive traces 36 are routed over the bend and are connected to the substrate electrodes in the bonding region 22, 24 of the electrical conductor 18.

Figure 2A:
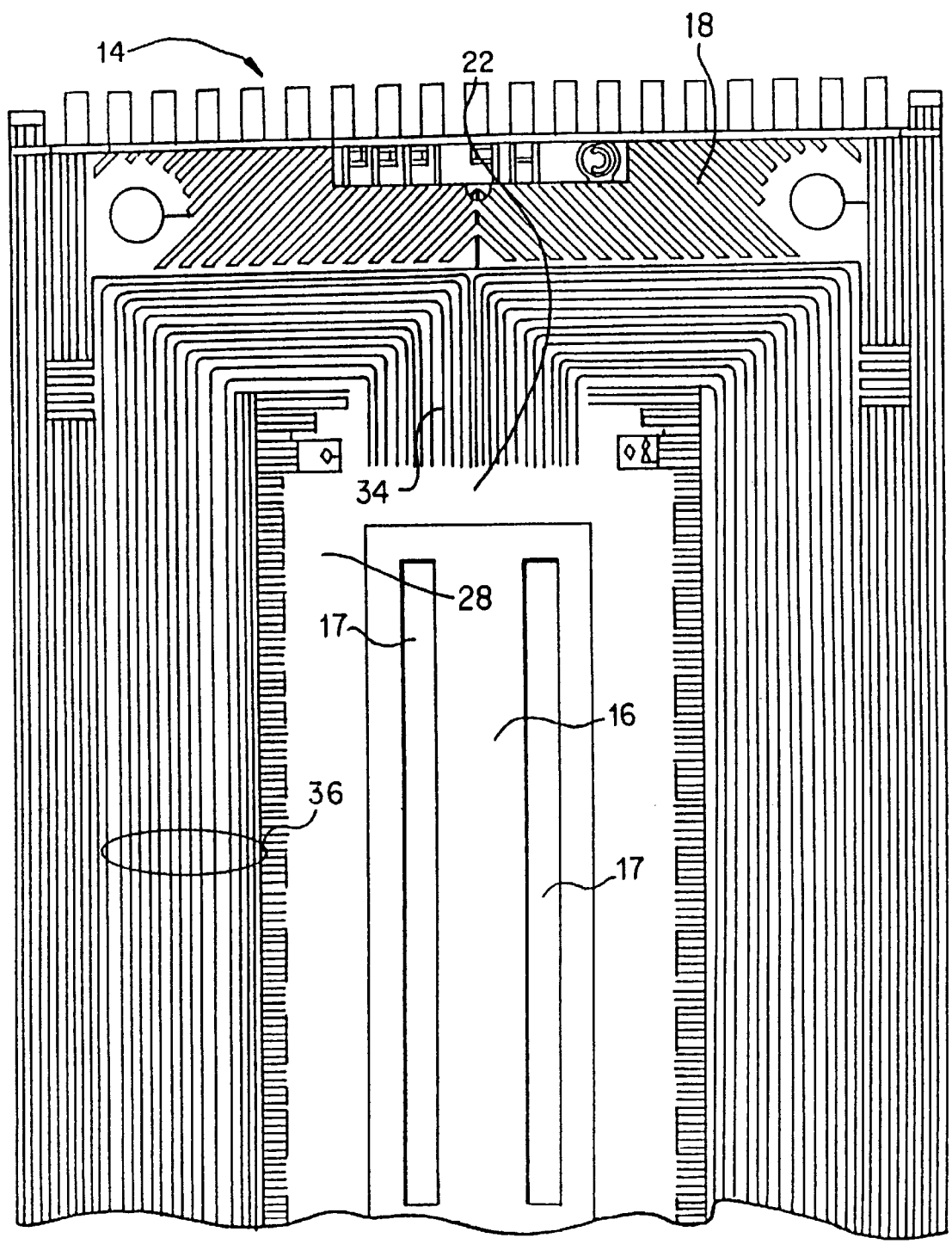
FIG. 2 is a perspective view of the front surface of the electrical conductor removed from the print cartridge of FIG. 1.
Figure 2B:
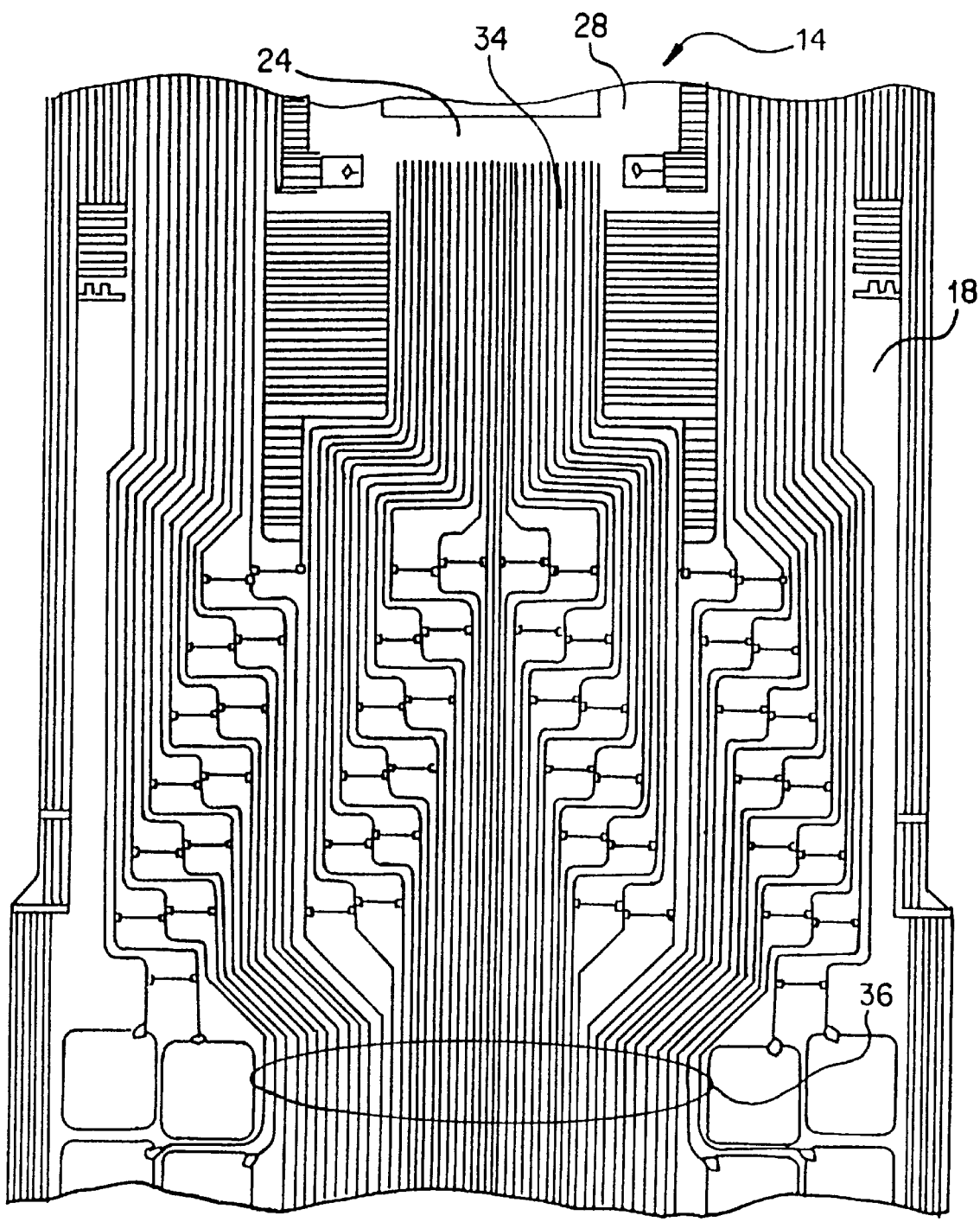
Figure 2C:
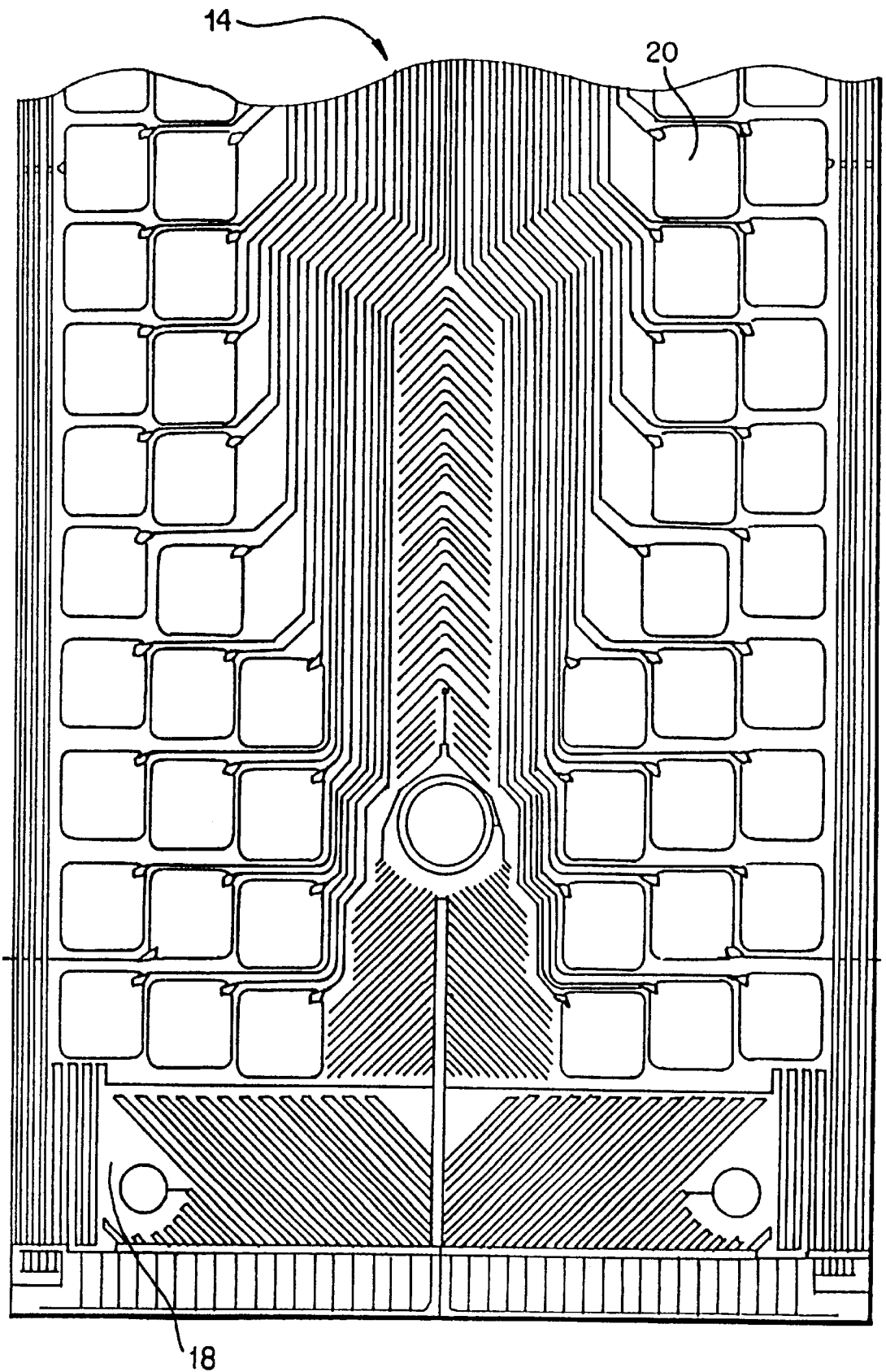

FIG. 2 shows a top plan view of the printhead assembly 14 of FIG. 1 removed from the print cartridge 10. The electrical conductor 18 has affixed to the back a silicon substrate 28 containing a plurality of individually energizable thin film resistors. Each resistor is located generally behind a single orifice 17 and acts as an ohmic heater when selectively energized by one or more pulses applied sequentially or simultaneously to one or more of the contact pads 20. The electrical conductor 18 shown in FIG. 2 has enough conductive traces 36 to control approximately 300 resistors on the substrate 28. The conductive traces 36 may be of any size, test, and pattern, and the various figures are designed to simplify and clearly show the features of the invention. The relative dimensions of the various features have been greatly adjusted for the sake of clarity.

FIG. 3 shows a highly simplified schematic of the back surface of the printhead assembly 14 of FIG. 2 showing the silicon die or substrate 28 mounted to the back of the electrical conductor 18 and also showing one edge of the barrier layer 30 formed on the substrate 28 containing ink channels and vaporization chambers. Shown along the edge of the barrier layer 30 are the entrances to the ink channels 32 which receive ink from the ink reservoir 12. The conductive traces 36 formed on the back of the electrical conductor 18 terminate in contact pads 20 and in leads 34 for bonding to the substrate electrodes 40. The bonding areas 22 and 24 locate where the leads 34 of the conductive traces 36 and the substrate electrodes 40 are bonded.

FIG. 4 shows a side view cross-section taken along line A—A in FIG. 3 illustrating the connection of the ends of the leads 34 of conductive traces 36 to the electrodes 40 formed on the substrate 28. A portion 42 of the barrier layer 30 is used to insulate the ends of the conductive traces 36 from the substrate 28. Also shown is a side view of the electrical conductor 18, the barrier layer 30, the bonding areas 22 and 24, and the entrances of the various ink channels 32. Droplets of ink 46 are ejected from orifice holes associated with each of the ink channels 32. Electrical conductor 18 may be Kapton™, Upilex™, or similar type polymer electrical conductor. Some such films may comprise teflon, polyamide, polymethylmethacrylate, polycarbonate, polyester, polyamide polyethylene-terephthalate or mixtures thereof.

Figure 5:
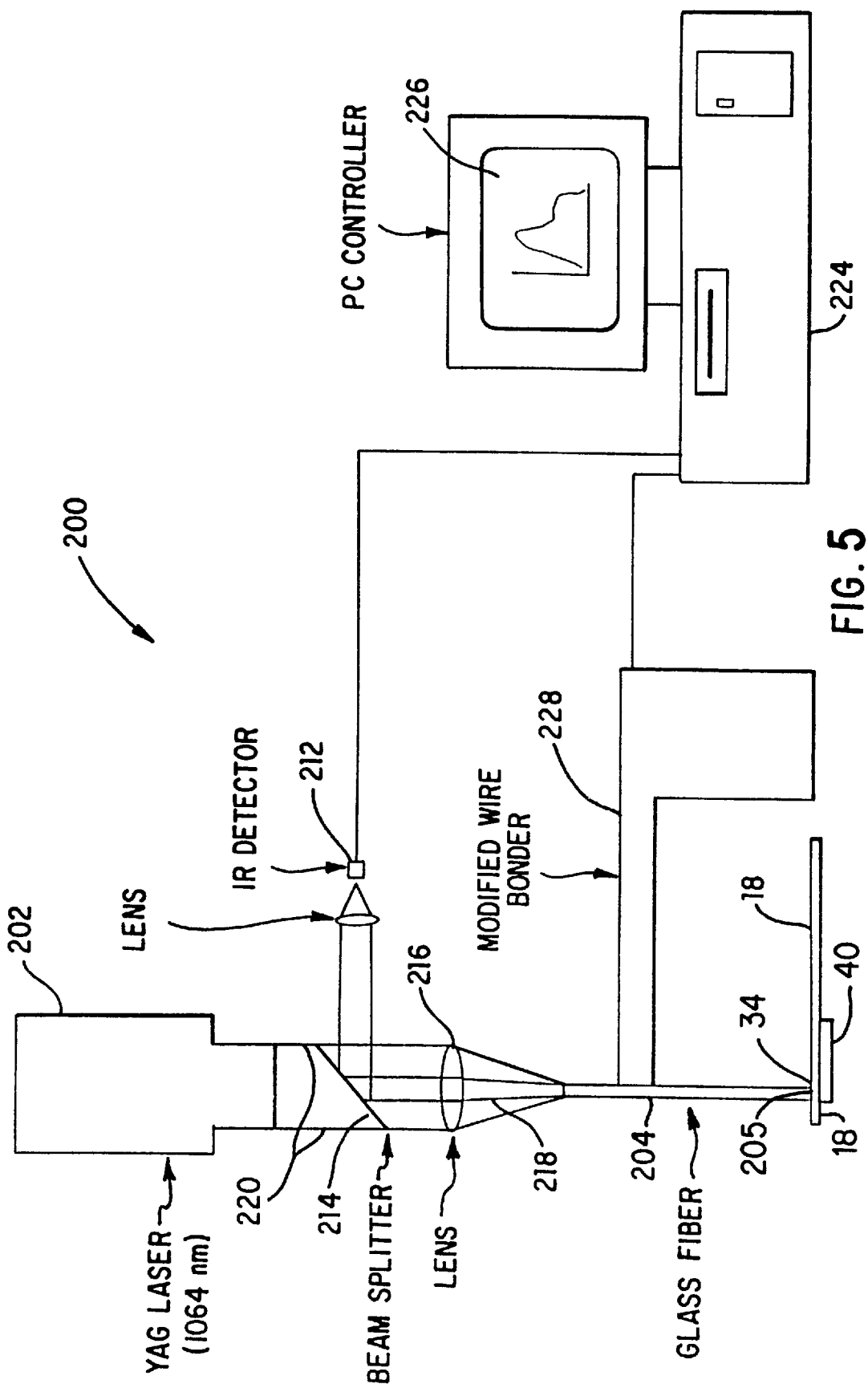
FIG. 5 is a schematic diagram for a fiber push connect laser system as used with the present invention.
Figure 6:
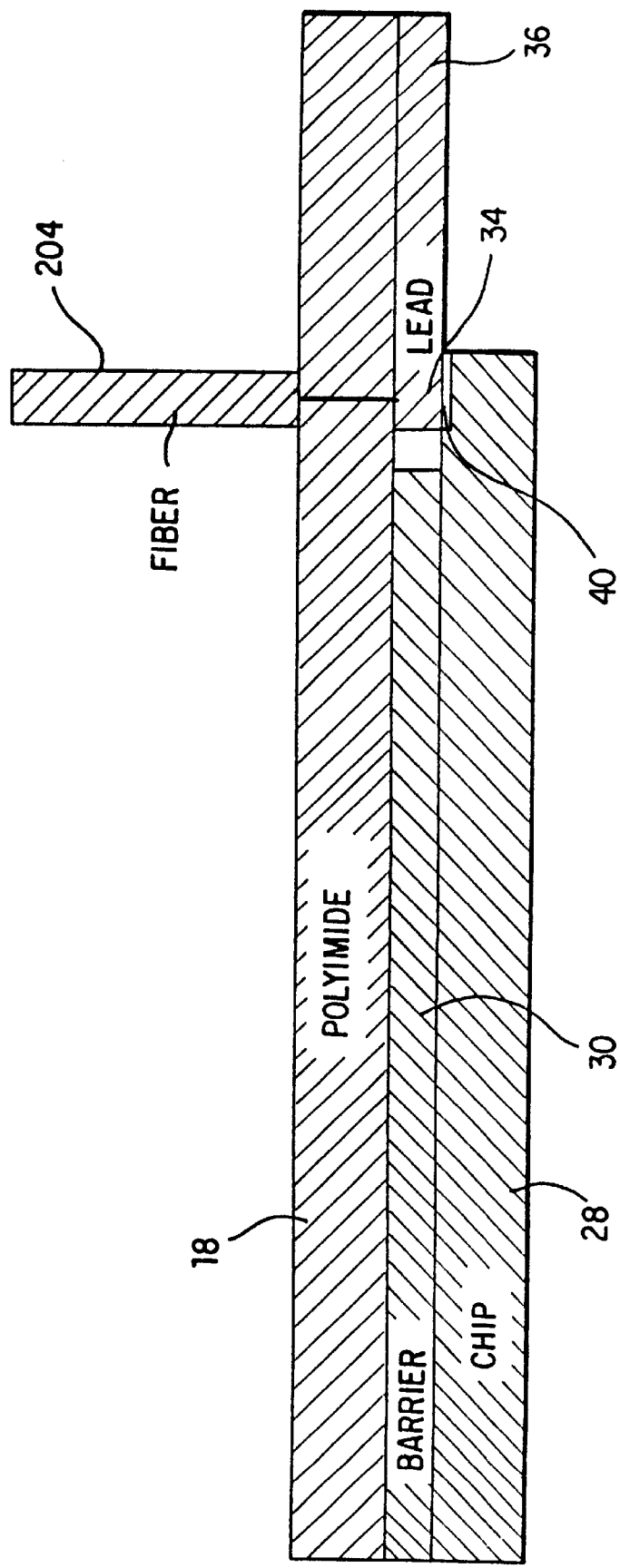
FIG. 6 shows in detail the electrical conductor, the contact bond point, the electrical conductor lead and the substrate electrode.

A schematic for a Fiber Push Connect ("FPC") laser bonding system 200 is illustrated in FIG. 5. This system consists of an Nd YAG or Diode laser 202, equipped with a glass optical fiber 204. The system guides the laser beam to the attach point or bonding region 22, 24 via the optical glass fiber 204. An optimum thermal coupling is achieved by pressing the lead 34 and substrate electrode 40 together by means of the optical fiber 204 which creates a zero contact gap between the lead 34 and substrate electrode 40 and thus improved thermal efficiency. This forcing of the electrical leads by the optical fiber 204 eventually leads to damage of the optical fiber as discussed below. FIG. 6 shows a cross-sectional view of the electrical conductor 18, the bonding regions 22, 24, leads 34 on conductive traces 36 and substrate electrodes 40.

A feedback temperature loop is achieved by means of an infrared detector 212 through the glass optical fiber. The temperature or absorption behavior response of the IR-radiation reflected by the contact elements 34, 40 at the bonding regions 22, 24 is gathered. The outgoing laser beam 220 from the laser source 202 goes through a half-transmission mirror or beam splitter 214 and through a focussing lens 216 into the glass optical fiber 204. The reflected light 218 from the optical fiber shown with dashed lines is reflected by the half mirror 21 and arrives via focussing lens 222 at an IR detector 212 that is connected to a PC Controller 224. The graph shown on the monitor 226 of PC controller 224 is meant to show that the PC Controller 224 can store definite expected plots for the temperature variation of the bonding process with which the actual temperature variation can be compared. The PC Controller 224 is connected with the laser source 202 so that the laser parameters can be controlled if necessary.

The reproducibility of a FPC laser bond depends both on a high degree of thermal coupling between the two connectors 34, 40 and high absorption of the laser energy by conductive leads 34, 40. To optimize the bonding process, minimum absorption is desired in the Kapton electrical conductor and maximum absorption is desired in the electrical conductor 18 metal layer. Metals with higher absorption rate will transform a higher share of the laser energy into heat. This will result in a shorter attach process which in turn will result in a higher quality bond.

The laser utilized is a YAG laser with a wavelength of 1064 nm. The YAG laser beam passes through the layer of polyamide without any absorption. A layer is required to provide a material which absorbs the laser energy. Chromium and molybdenum have the highest absorption characteristics at this wavelength. Chromium is often used as the seed metal because most electrical conductor manufacturers are already using chromium extensively to provide an adhesion layer between the copper trace and Kapton polyamide in electrical conductor manufacturing processes.

The laser beam creates a localized heated zone in the chromium causing the metals (or solder material), to melt and create a bond between two joining electrical members without increasing the temperature of the Kapton electrical conductor. However, any gap between the two mating metal parts will cause overheating of the metal surface exposed to the laser beam. The optical fiber is used to push the two mating metal parts together to avoid any gap.

Further details regarding fiber push laser bonding are described in U.S. patent application Ser. No. 08/843,492, filed Apr. 16, 1997, entitled, "Solderless Connection of Electrical Contacts Utilizing Combination Laser and Fiber Optic Push Connect System" and U.S. patent application Ser. No. 08/705,928, filed Aug. 30, 1996, entitled "Laser Welded Inkjet Printhead Assembly Utilizing a Combination Laser and Fiber Optic Push Connect System." The foregoing commonly assigned U.S. patent applications are herein incorporated by reference.

In the windowless electrical conductor bonding process, a fiber is utilized to transfer the laser energy from the laser to the bond site. The quality of the bond joint is adversely affected by damage to the fiber tip. Due to repeated impact of the fiber tip, the fiber gradually gets damaged. This damage to the fiber will cause a higher portion of the laser energy to be lost, and not be absorbed by the electrical conductor lead. Therefore, bonds are made with lower laser power, and less strength. Since no burning has occurred, laser IR detector does not detect any laser energy variation which in turn means no bad bond is detected.

Figure 7:
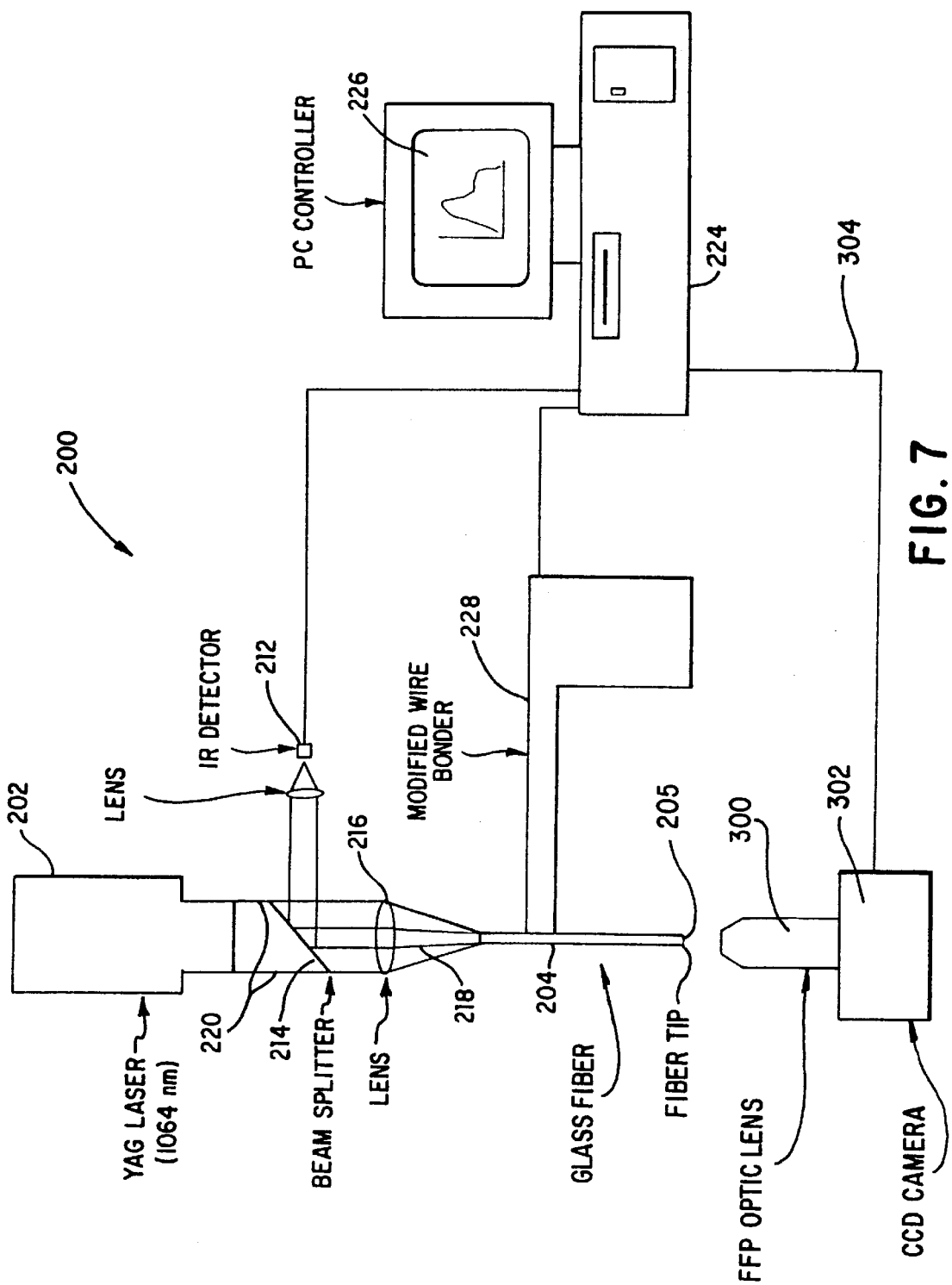
FIG. 7 is a schematic diagram for a fiber push connect laser system of the present invention.

Referring to FIG. 7, the present invention uses a far field pattern optical lens 300, a CCD camera 302 and imaging software to capture a spatial view of the laser power spectral output at the end of fiber 204. In FIG. 7 no electrical leads are in position when the laser beam analysis is taking place. The far field optical lens 300 is specialized for measuring the far field pattern (FFP) of the beam of an optical fiber in real time. The output pattern shows the two-dimensional angular intensity distribution of the light beam. You can measure various parameters of FFP using it with a video camera and an image analyzing processor. The far field pattern optical lens 300 consists of a F-θ lens, a field lens and a relay lens. The F-θ lens is key device for the FFP Optics. A suitable far field pattern optical lens is Coherent's Model A3267-05. The output of the FFP lens is captured by the CCD camera 302.

Charge-coupled-device (CCD) cameras are solid-state devices with many useful characteristics for doing laser-beam diagnostics. The CCD camera, and the with digitizing and processing electronics in combination, primarily have two features. First, they give a picture of the beam profile so that the user can effectively see what the profile looks like. The fast response in both two- and three-dimensional modes provides an insightful, intuitive perspective on the beam characteristics. Second, digitizing electronics can extract detailed quantitative measurements on beam characteristics, which allow the user to precisely determine the properties of the laser beam and to make adjustments and improvements in its performance. The quantitative and visual feedback complement each other by simultaneously enabling precise operation. In addition, the quantitative data provide a permanent record of the setup and results. An example of a suitable CCD camera is Coherent's Model COHU 48.

The illuminance distribution pattern obtained by the CCD camera is equivalent angular intensity distribution of the light source. In other words, the image obtained by FFP optics is the radiation angle pattern projected on a hemispherical screen from the luminous point of view.

The output of the CCD camera is transmitted to the PC via line 304 which is connected to a PC Controller 224. The graph shown on the monitor 226 of PC controller 224 is meant to show that the PC Controller 224 and monitor 226 can store and display a spatial spectrum of the laser beam at the tip 205 together with expected plots for the temperature variation of the bonding process with which the actual temperature variation can be compared. The PC Controller 224 is connected with the laser source 202 so that the laser parameters can be controlled if necessary. The PC controller 224 holds and executes the video laser beam analyzing software.

The beam analyzing software is a standard laser beam analysis software that allows for capturing and displaying peak intensity and position, peak power density, relative power and energy, area uniformity and beam diameter. An example of suitable beam analyzing software is Coherent/Auburn Group's BeamView Analyzer PC software. The foregoing setup enables one to view the spatial spectrum of the laser beam as it exits the fiber.

The analysis and method of the present invention proceed at intermittent intervals between operations of (e.g. by interrupting) the bonding process, performing the analysis of the laser beam at the tip 205 of the optical fiber 204. When the analysis determines that the optical fiber is defective, the fiber can either be replaced or repaired if that is possible. It is important to stress that it is spatial energy spectrum distribution across the fiber that is used in the method of the present invention. The absolute energy level is not important for the analysis of the present invention.

Figure 8:
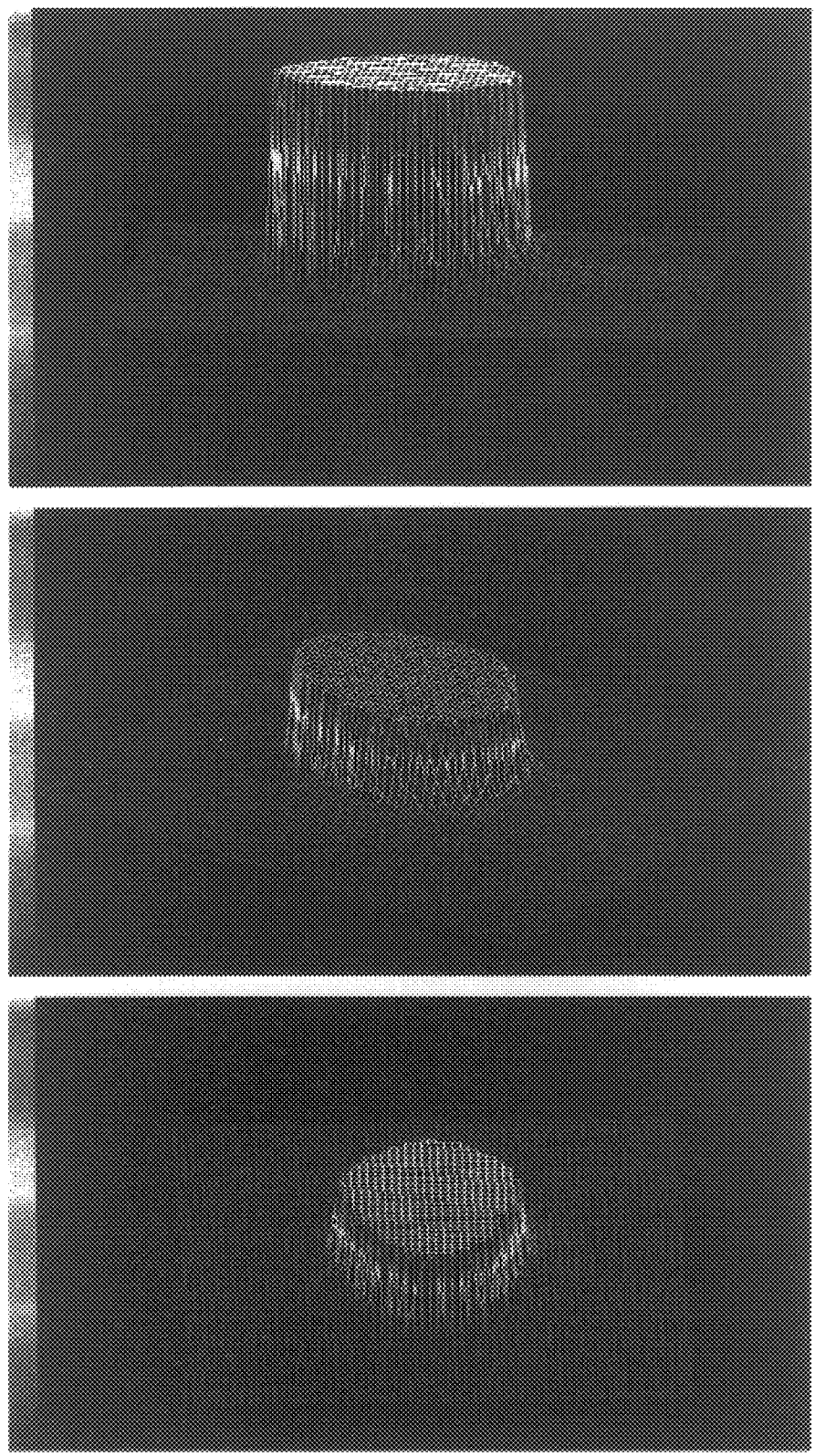
FIG. 8 illustrates the spatial energy spectrum of a clean fiber.

FIG. 8 illustrates the spatial energy spectrum of a clean fiber. The laser energy strength color map is illustrated to the left of the picture. As can be observed from FIG. 7, the laser energy is well distributed spatially over the fiber and no "hot spots" are observed.

FIG. 9 illustrates the spatial energy spectrum of a damaged fiber. In this case several "hot spots" indicated by purple and red may clearly be observed. "Hot spots" result in localized heating of the polyamide and bonds. This results in local burning and lack of a uniformly strong bond. This process of the present invention may be used to evaluate the optical fiber and thus predict and avoid bad bonds and bond joint strength without any destructive testing, by evaluating the spatial energy distribution of light emanating from the tip of the fiber. The process of the present invention also reduces the quantity of parts that have to scrapped.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A method of performing optical fiber push laser bonding operations on electric conductor leads, comprising:
    providing an optical fiber push laser bonding system having an optical fiber for directing a laser beam;
    performing laser bonding operations with said bonding system;
    generally concurrently with the laser bonding operations, examining the mechanical integrity of the fiber; and
    analyzing the condition of the optical fiber in order to determine the need for corrective action.

2. The method of claim 1, wherein the laser bonding operations comprise:
    positioning first and second electrical leads in a bonding position;
    holding the first and second electrical leads in contact at a bond surface with the optical fiber;
    bonding the first and second electrical leads at the bond surface by directing the laser beam through the optical fiber; and
    repeating said positioning, holding and bonding steps for a plurality of bonds.

3. The method of claim 1, wherein the examining and analyzing steps comprise the substeps of:
    directing a beam of light to the optical fiber;
    detecting light from the fiber tip; and
    analyzing the detected light to determine said optical fiber condition.

4. The method of claim 3, wherein:
    the beam of light is from a laser.

5. The method of claim 4, wherein:
    the beam of light is from the same laser used in the bonding operations.

6. The method of claim 5, wherein:
    the beam of light is directed through the optical fiber; and
    the detecting and analyzing substeps comprise capturing a spatial energy distribution of the laser beam after passage through the fiber and relating the captured spatial energy distribution to known distributions of intact and damaged fibers respectively.

7. The method of claim 6, wherein:
    the examining step comprises interrupting the laser bonding operations; and
    A the directing and detecting substeps are performed during said interrupting.

8. The method of claim 3, wherein:
    the detected-light analyzing step comprises analyzing a spatial energy distribution of the detected light to determine said optical fiber condition.

9. The method of claim 8, wherein:
    the detected-light analyzing step comprises automatically analyzing a signal from a video camera that receives a far field pattern of light from the fiber.

10. The method of claim 1, in further combination with the step of:
    replacing or repairing the fiber.

11. The method of claim 1, particularly for use in manufacture of inkjet printheads, and wherein:
    the electric conductor leads are part of an inkjet printhead flex-circuit subassembly, and are bonded by the laser bonding operations to electrodes on a silicon substrate associated with a barrier layer of the printhead.

12. A method of bonding operations electric conductor leads, comprising the steps of:
    using an optical fiber to push together electrical conductor leads to be bonded;
    directing a laser beam through the fiber, while the fiber is pushing the leads together, to form a bond between the leads;
    interrupting the using and directing steps;
    monitoring the fiber condition during said interrupting of the using and directing steps; and
    if said monitoring indicates a high probability of said bond being weak, then repairing or replacing the fiber.

* * * * *